(12) United States Patent
Blusseau

(10) Patent No.: US 10,208,913 B2
(45) Date of Patent: Feb. 19, 2019

(54) LIGHTING MODULE COMPRISING AT LEAST ONE REMOVABLE LIGHT SOURCE

(71) Applicant: VALEO VISION, Bobigny (FR)

(72) Inventor: Eric Blusseau, Bobigny (FR)

(73) Assignee: VALEO VISION, Bobigny (FR)

( * ) Notice: Subject to any disclaimer, the term of this patent is extended or adjusted under 35 U.S.C. 154(b) by 4 days.

(21) Appl. No.: 15/690,447

(22) Filed: Aug. 30, 2017

(65) Prior Publication Data
US 2018/0058654 A1 Mar. 1, 2018

(30) Foreign Application Priority Data

Aug. 30, 2016 (FR) ...................................... 16 58031

(51) Int. Cl.
*F21S 41/692* (2018.01)
*F21S 41/10* (2018.01)
(Continued)

(52) U.S. Cl.
CPC .......... *F21S 41/692* (2018.01); *B60Q 1/0064* (2013.01); *B60Q 1/0088* (2013.01); *B60Q 1/2696* (2013.01); *F21S 41/141* (2018.01); *F21S 41/147* (2018.01); *F21S 41/19* (2018.01); *F21S 41/40* (2018.01); *F21S 45/10* (2018.01); *F21S 45/47* (2018.01); *F21S 41/39* (2018.01);
(Continued)

(58) Field of Classification Search
CPC ........ F21S 41/692; F21S 41/19; F21S 41/141; F21S 41/40; F21S 45/10; F21S 45/47; B60Q 1/0088
See application file for complete search history.

(56) References Cited

U.S. PATENT DOCUMENTS

| | | | |
|---|---|---|---|
| 7,988,336 B1 | 8/2011 | Harbers et al. | |
| 2010/0195345 A1* | 8/2010 | Sugie | F21S 41/196 362/516 |

(Continued)

FOREIGN PATENT DOCUMENTS

| | | |
|---|---|---|
| EP | 2 706 292 A1 | 3/2014 |
| JP | 2000-149620 | 5/2000 |

(Continued)

OTHER PUBLICATIONS

French Preliminary Search Report dated May 10, 2017 in French Application 16 58031 filed on Aug. 30, 2016 (with English Translation of Categories of Cited Documents).

*Primary Examiner* — Laura Gudorf
(74) *Attorney, Agent, or Firm* — Oblon, McClelland, Maier & Neustadt, L.L.P.

(57) ABSTRACT

Lighting module for a motor vehicle including an optical means that is fixedly mounted in the lighting module and has a base with a first housing. Also included is a carrier of the optical means, which is movable with respect to the optical means about an axis of rotation. The carrier of the optical means has a base with a second housing. The carrier of the optical means is able to take a closed position in which at least one light source is held partially in first housing and partially in the second housing, an open position in which said at least one light source may be removed from the lighting module, the at least one light source is removable and has light-emitting means and a mechanical carrier of the light-emitting means.

20 Claims, 6 Drawing Sheets

(51) Int. Cl.
*B60Q 1/26* (2006.01)
*B60Q 1/00* (2006.01)
*F21S 41/39* (2018.01)
*F21S 45/10* (2018.01)
*F21S 41/19* (2018.01)
*F21S 41/141* (2018.01)
*F21S 41/40* (2018.01)
*F21S 45/47* (2018.01)
*F21S 41/147* (2018.01)
*F21Y 115/10* (2016.01)

(52) U.S. Cl.
CPC ..... *F21Y 2115/10* (2016.08); *H05K 2203/166* (2013.01)

(56) References Cited

U.S. PATENT DOCUMENTS

| | | | |
|---|---|---|---|
| 2011/0267822 A1 | 11/2011 | Harbers et al. | |
| 2013/0021808 A1 | 1/2013 | Harbers et al. | |
| 2014/0334175 A1* | 11/2014 | Jha .................... | F21S 48/1225 362/520 |
| 2015/0308652 A1 | 10/2015 | Cabanne et al. | |
| 2017/0198878 A1* | 7/2017 | Lee .................... | F21S 48/1794 |

FOREIGN PATENT DOCUMENTS

| | | |
|---|---|---|
| JP | 2004-265619 | 9/2004 |
| JP | 2012-174504 | 9/2012 |
| WO | WO 2014/083123 A1 | 6/2014 |

\* cited by examiner

LIGHTING MODULE COMPRISING AT LEAST ONE REMOVABLE LIGHT SOURCE

TECHNICAL FIELD OF THE INVENTION

The present invention relates to a lighting module for a motor vehicle. It has a particular but nonlimiting application in lighting devices such as motor vehicle headlamps.

BACKGROUND OF THE INVENTION

A lighting module for a motor vehicle comprises, as known to those skilled in the art:
an optical means;
a carrier of the optical means;
at least one light source housed in the lighting module.
The light source comprises:
light-emitting means;
a mechanical carrier of the light-emitting means.
The lifetime of a light source such as a semiconductor emitting chip is generally longer than 3000 hours of operation. In case of malfunction, the question of replacement of this light source must then be addressed. In order to replace a defective light source, it is known practice to remove the entire lighting module, i.e. the optical means and the defective light source.

One drawback of this prior-art method is that replacing the entire lighting module leads to scrappage of elements, such as the optical means, which are not necessarily defective. The user must thus purchase a new complete lighting module each time a light source becomes defective, this making the operation of replacement of the lighting module more expensive.

In this context, the present invention aims to solve the aforementioned drawback.

GENERAL DESCRIPTION OF THE INVENTION

To this end, the invention proposes a lighting module for a motor vehicle, said lighting module comprising:
an optical means that is fixedly mounted in the lighting module, said optical means comprising a base with a first housing;
a carrier of the optical means, which is movable with respect to the optical means about an axis of rotation, said carrier of the optical means comprising a base with a second housing, said carrier of the optical means being able to take:
  a closed position in which at least one light source is held partially in said first housing and partially in said second housing; and
  an open position in which said at least one light source may be removed from the lighting module;
said at least one light source being removable and comprising:
  light-emitting means;
  a mechanical carrier of the light-emitting means.

Thus, as will be seen in detail below, the removable light source is placed in a housing formed partially from a first housing belonging to the optical means and partially from a second housing belonging to the carrier of the optical means. The carrier of the optical means is movable with respect to the optical means between a closed position and an open position. In the open position, the light source is accessible to an operator and it is then possible to remove the defective light source from the lighting module. Only the light source is then replaced, thereby decreasing the overall cost of this maintenance operation.

According to some nonlimiting embodiments, the lighting module may further comprise one or more additional features from among the following:

According to one nonlimiting embodiment, the light source is blocked in the first housing or in the second housing:
  in a longitudinal direction at two primary reference points via two primary blocking means of the base of the optical means or the base of the carrier of the optical means;
  in a transverse direction, perpendicular to the longitudinal direction, at at least one secondary reference point via a secondary blocking means.

In particular, the light source is blocked in the first housing or in the second housing when the carrier of the optical means is in the closed position.

According to one nonlimiting embodiment, a primary blocking means is a leaf spring.

According to one nonlimiting embodiment, a primary blocking means is a chamfer.

According to one nonlimiting embodiment, a secondary blocking means is a leaf spring of the base of the optical means.

According to one nonlimiting embodiment, a second secondary blocking means is used to block the light source in the transverse direction, said second secondary blocking means being a chamfer of the base of the optical means facing said leaf spring, the chamfer and the leaf spring being placed on either side of the light source.

According to one nonlimiting embodiment, the optical means and the carrier of the optical means are mechanically connected to each other in order to ensure rotational guidance of the carrier of the optical means with respect to the optical means.

According to one nonlimiting embodiment, the lighting module furthermore includes means for moving the carrier of the optical means with respect to the optical means, which means are able to allow the carrier of the optical means to move rotably between said closed position and said open position.

According to one nonlimiting embodiment, the moving means are a return spring.

According to one nonlimiting embodiment, the light source is able to be positioned in said first housing of the optical means when the carrier of the optical means is in the open position.

In one nonlimiting embodiment, the optical means comprises:
  at least two primary blocking means for blocking the light source in the first housing in the longitudinal direction;
  at least one secondary blocking means for blocking the light source in the first housing in the transverse direction.

According to one nonlimiting embodiment, the light source is able to be positioned in said second housing of the carrier of the optical means when said carrier is in the open position.

In one nonlimiting embodiment, the optical means comprises:
  at least two primary blocking means for blocking the light source in the first housing in the longitudinal direction;
  at least one secondary blocking means for blocking the light source in the first housing in the transverse direction.

According to one nonlimiting embodiment, the carrier of the optical means comprises two primary blocking means for blocking the light source in the second housing in the longitudinal direction.

According to one nonlimiting embodiment, the light source is blocked in the first housing in a normal direction at at least three tertiary reference points.

According to one nonlimiting embodiment, the three tertiary reference points are three lugs belonging to a protective cover of the light source, said lugs being able to interact with a countersink belonging to the base of the optical means.

According to one nonlimiting embodiment, the lighting module furthermore comprises locking means for locking the optical means with the carrier of the optical means.

According to one nonlimiting embodiment, the lighting module furthermore comprises wedging means for holding an external electrical connector of the light source to said lighting module.

According to one nonlimiting embodiment, the carrier of the optical means is a radiator.

According to one nonlimiting embodiment, the light-emitting means include a semiconductor emitting chip.

BRIEF DESCRIPTION OF THE FIGURES

The invention and the various applications thereof will be better understood on reading the following description and on examining the accompanying figures.

DESCRIPTION OF EMBODIMENTS OF THE INVENTION

Elements that are identical, in structure or in function, and that appear in various figures have been given, unless specified otherwise, the same references.

The motor-vehicle lighting module 10 according to the invention is described with reference to FIGS. 1 to 11.

By motor vehicle, what is meant is any type of motorized vehicle.

In one nonlimiting embodiment considered in the remainder of the description, the lighting module 10 belongs to an lighting and/or signaling device. In one nonlimiting variant, the lighting and/or signaling device is a motor-vehicle headlamp.

Figure 1:
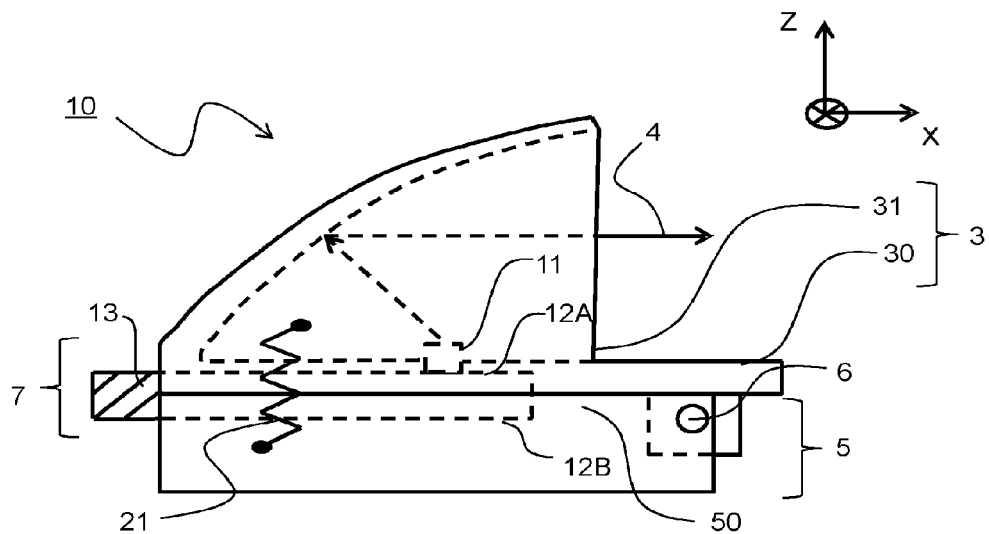
FIG. 1 schematically shows a side view of a motor-vehicle lighting module according to one nonlimiting embodiment of the invention, said lighting module comprising an optical means and a carrier of the optical means in a closed position in which a light source is held in said lighting module.
Figure 2:
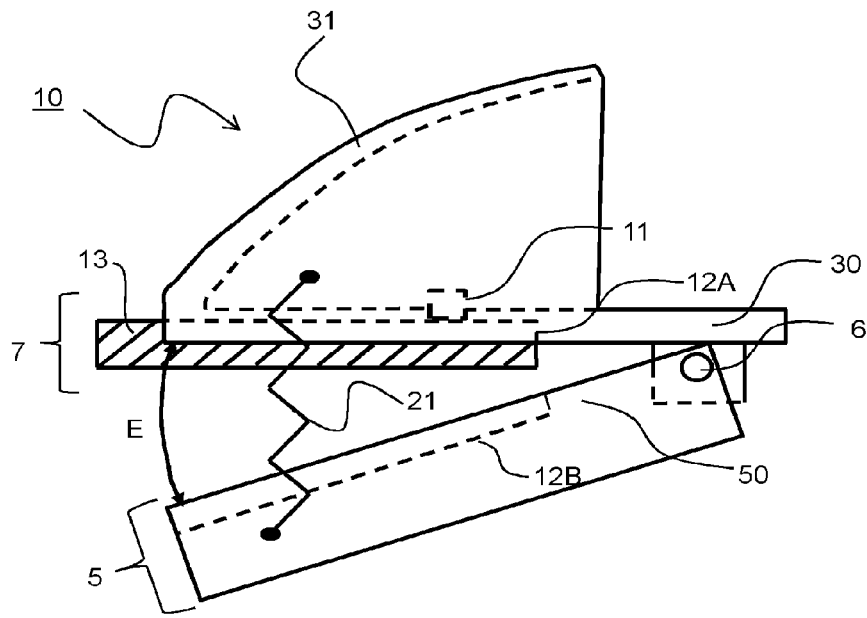
FIG. 2 schematically shows a side view of the lighting module of FIG. 1 according to one nonlimiting embodiment, said carrier of the optical means being in an open position in which the light source is accessible.

As illustrated in FIGS. 1 and 2, the lighting module 10 comprises:
  an optical means 3 that is fixedly mounted in the lighting module 10. This optical means comprises a base 30 defining a first housing 12A;
  a carrier 5 of the optical means 3, which is movable with respect to the optical means 3 about an axis of rotation 6. This carrier 5 of the optical means 3 comprises a base 50 defining a second housing 12B. The carrier 5 of the optical means 3 is able to take:
    a closed position in which at least one light source 7 is held partially in the first housing 12A and partially in the second housing 12B; and
    an open position in which the light source 7 may be removed from the lighting module 10.
  the light source 7 is removable and comprises:
    light-emitting means 11;
    a mechanical carrier 13 of the light-emitting means 11.

The lighting module 10 is able to emit light rays 4 forming a light beam. In one nonlimiting example, the lighting module 10 is able to provide what is called a "high-beam" photometric function, in order to provide maximum illumination. In another nonlimiting example, the lighting module 10 is able to provide what is called a "low-beam" photometric function, in order, for example, to prevent other road users from being dazzled.

The various elements of the lighting module 10 are described in detail below.

Optical Means

In one nonlimiting embodiment, the optical means 3 is:
a reflector;
a lens; or
a light guide; or
a collimator.

The optical means 3 interacts with the light source 7 described below to form light rays 4.

In the nonlimiting example illustrated in FIGS. 1, 2, 9, 10 and 11, the optical means 3 is a reflector that comprises a mirror 31 and a base 30.

Light Source

Apart from the light-emitting means 11 and the mechanical carrier 13, the light source 7 comprises an electrical-connection interface 16.

The electrical-connection interface 16 allows the light-emitting means 11 to be supplied with electrical power and controlled.

The electrical-connection interface 16 is able to interact with an external electrical connector that allows control signals to be sent to the light source 7 and it to be powered.

The light source 7 is able to interact with the optical module 3.

In one nonlimiting embodiment, the light source 7 comprises a plurality of light-emitting means 11. In the nonlimiting example illustrated in FIGS. 3, 5 and 8, there are six light-emitting means.

In one nonlimiting embodiment, the light-emitting means 11 include at least one semiconductor emitting chip.

In one nonlimiting variant, the semiconductor emitting chips are constituents of light-emitting diodes. By light-emitting diodes, what is meant is any type of light-emitting diode, i.e., to give a number of nonlimiting examples, LEDs (light-emitting diodes), OLEDs (Organic LEDs), AMO-LEDs (active-matrix organic LEDs) or even FOLEDs (flexible OLEDs).

The light source 7 is removable, namely it may be removed from the lighting module 10 without removing the optical module 3 from said lighting module 10. The light source 7 is thus interchangeable.

Carrier of the Optical Means

In one nonlimiting embodiment, the carrier 5 of the optical means 3 is a radiator that allows the heat originating from the light source 7 to be removed from the lighting module 10.

The carrier 5 of the optical means 3 is movable with respect to the optical means 3 and it is its movement between the closed position and the open position that will allow the light source 7 to be removed from the lighting module 10.

In one nonlimiting embodiment, the optical means 3 and the carrier 5 of the optical means 3 are mechanically connected level with the axis of rotation 6 in order to ensure rotational guidance of the carrier 5 of the optical means 3 with respect to said optical means 3.

In one nonlimiting embodiment, the lighting module 10 includes means 21 for moving the carrier 5 of the optical means 3 with respect to the optical means 3. These moving means 21 are able to allow the carrier 5 of the optical means 3 to move rotably between its closed position and its open position.

In one nonlimiting embodiment, such as illustrated in FIG. 1, the moving means 21 are a return spring.

In the closed position of the carrier 5 of the optical means 3, i.e. the position illustrated in FIG. 1, the return spring 21 is at rest.

In the open position of the carrier 5 of the optical means 3, i.e. the position illustrated in FIG. 2, the return spring 21 is under tension.

In the example embodiment shown in FIG. 2, the carrier 5 of the optical means 3 is held in the open position by the operator in order to allow the light source 7 to be removed from the lighting module 10. Once the light source 7 has been removed, the operator releases the carrier 5 of the optical means 3. It is then brought back against the optical means 3 by the action of the return spring 21. The return spring 21 thus allows the carrier 5 of the optical means 3 to be rapidly and automatically brought back to its closed position. Furthermore, the return spring 21 allows residual play that may exist between the optical means 3 and the carrier 5 of the optical means to be compensated. This compensation of residual play allows the contact between the optical means 3 and the carrier 5 of the optical means 3 (in particular between their bases 30 and 50) to be improved.

In the closed position of the carrier 5 of the optical means 3, i.e. the position such as shown in FIG. 1:

the optical means 3 and the carrier 5 of the optical means 3 make contact. More particularly, the base 30 of the optical means 3 and the base 50 of the carrier 5 of the optical means 3 make contact;

the first housing 12A and the second housing 12B are directly opposite each other;

the light source 7 is blocked in the optical module 10. More particularly, the mechanical carrier 13 of the light-emitting means 11 is:

blocked horizontally in the first housing 12A of the optical means 3 or the second housing 12B of the carrier 5 of the optical means 3;

blocked vertically by the optical means 3 against the carrier 5 of said optical means 3.

The light source 7 is thus held in position in the optical module 3. In this way, the light-emitting means 11 of the light source 7 are positioned and blocked in a focal zone F of the optical means 3. This makes it possible to obtain a good focus on the optical module 3 and thus to optimize the light beam.

In one nonlimiting embodiment, the light source 7 is blocked in the first housing 12A or in the second housing 12B when the carrier 5 of the optical means 3 is in the closed position:

in a longitudinal direction X at two primary reference points 9A, 9B (described below) via two primary blocking means 14A, 14B, 16A, 16B, 23A, 23B (described below) of the base 30 of the optical means 3 or the base 50 of the carrier of the optical means 5;

in a transverse direction Y, perpendicular to the longitudinal direction X, at at least one secondary reference point 15 (described below) via a secondary blocking means 18 of the base 30 of the optical means 3 (described below).

In one nonlimiting embodiment, the light source 7 is blocked in the first housing 12A and the second housing 12B when the carrier 5 of the optical means 3 is in the closed position, in a normal direction Z, at tertiary reference points 25A, 25B, 25C, against which the optical module 3 (in particular its base 30) bears when the carrier 5 of the optical module 3 is in the closed position.

Figure 9:
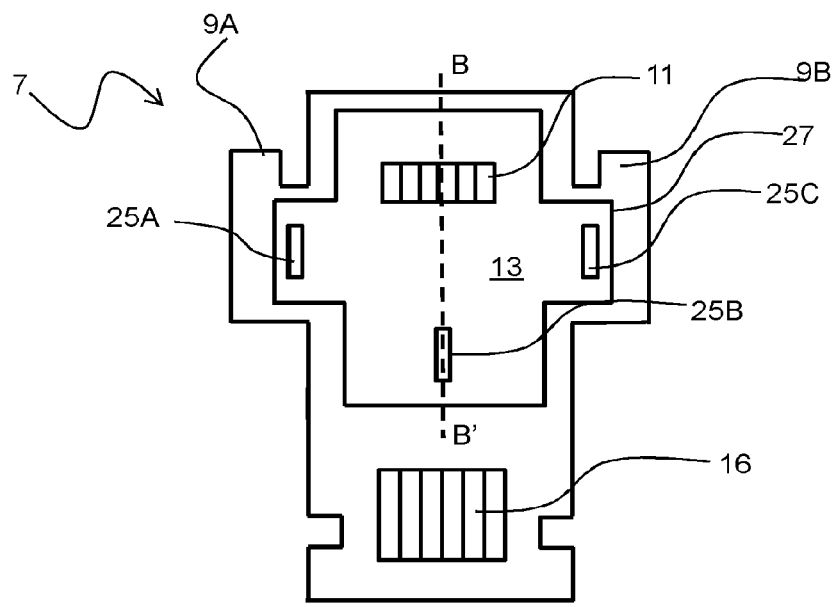
FIGS. 9 and 10 show, according to one nonlimiting embodiment, a top view of the light source when it is held in the lighting module of FIG. 1 in a normal direction Z.

In one nonlimiting embodiment illustrated in FIG. 9, the light source 7 comprises three tertiary reference points 25A, 25B, 25C for blocking the light source 7 in the first housing 12A and the second housing 12B in the normal direction Z.

Figure 10:
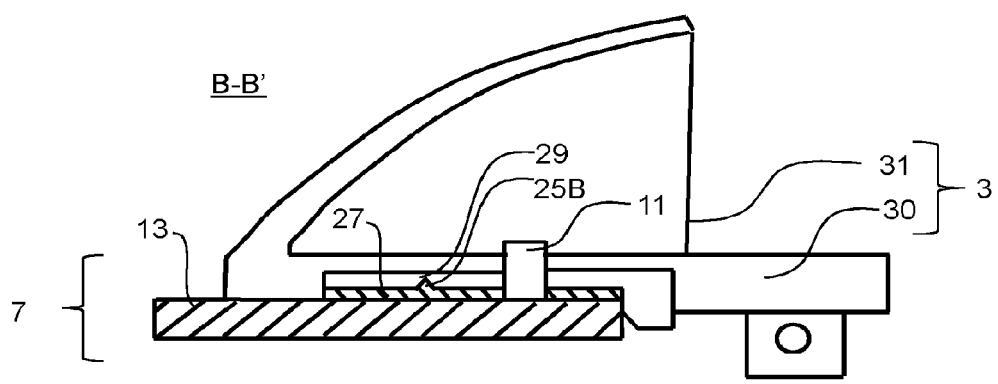

In one nonlimiting embodiment illustrated in FIG. 10, the tertiary reference points 25A, 25B, 25C are lugs that come to be housed in countersinks 29 of the optical means 3. In this case, the base 30 of the optical module 3 has a thickness in which these countersinks 29 are formed. The countersinks 29 bear against the lugs so that, in the closed position, the optical means 3 holds the light source 7 in position in the normal direction Z. The base 30 thus allows the isostatism in Z of the light source 7 to be managed via the tertiary reference points 25A, 25B, 25C.

Figure 8:
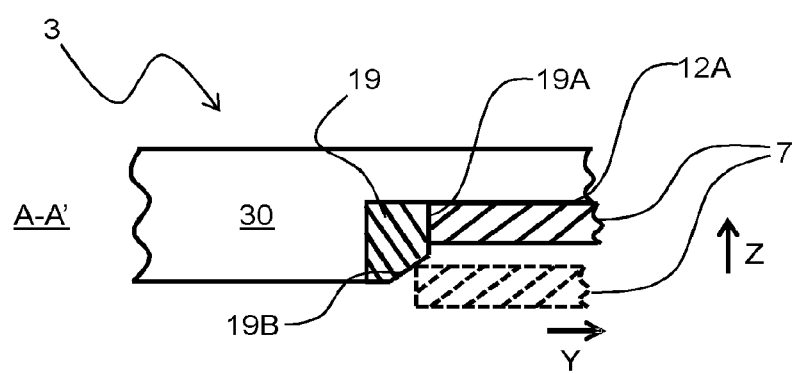
FIG. 8 is a cross-sectional view along the axis A-A' in FIG. 3, level with a means for blocking the light source in the first housing of the optical means.

In one nonlimiting embodiment illustrated in FIG. 8, the light source 7 furthermore comprises a protective cover 27. The protective cover 27 comprises an opening in order to let the light emitted by the light-emitting means 11 pass. In this case, the tertiary reference points 25A, 25B, 25C are placed on the protective cover 27. In the nonlimiting example of FIG. 8, three lugs correspond to the tertiary reference points 25A, 25B, 25C.

In the open position of the carrier 5 of the optical means 3, i.e. the position such as shown in FIG. 2:

the optical means 3 and the carrier 5 of the optical means 3 are a distance apart from each other, i.e. they no longer make contact. More particularly, the base 30 of the optical means 3 and the base 50 of the carrier 5 of the optical means 3 no longer make contact;

the first housing 12A and the second housing 12B are a distance apart from each other, i.e. they are no longer directly opposite;

the light source 7 remains in one of the two housings 12A or 12B but is accessible and may be removed from the lighting module 10. When it is in the housing 12A, the light source 7 is blocked in the transverse direction Y. When it is in the housing 12B, the light source 7 is blocked along no axis.

A space E is thus created between said optical means 3 and the carrier 5 of the optical means 3. This space E allows an operator to access the light source 7 with a view to removing the lighting module 10.

It will be noted that this space E is also large enough to clean residues from the thermal interface located between the light source 7 and more particularly between its mechanical carrier 13, and the carrier 5 of the optical means 3. It will be recalled that this thermal interface makes it possible to ensure that heat is conducted between the carrier 5 of the optical means 3 and the light source 7.

The lighting module 10 of FIGS. 1 and 2 is described below by way of three nonlimiting embodiments.

First Embodiment

The lighting module 10 comprises the optical means 3, the carrier 5 of the optical means 3 and the light source which were described above.

Figure 3:
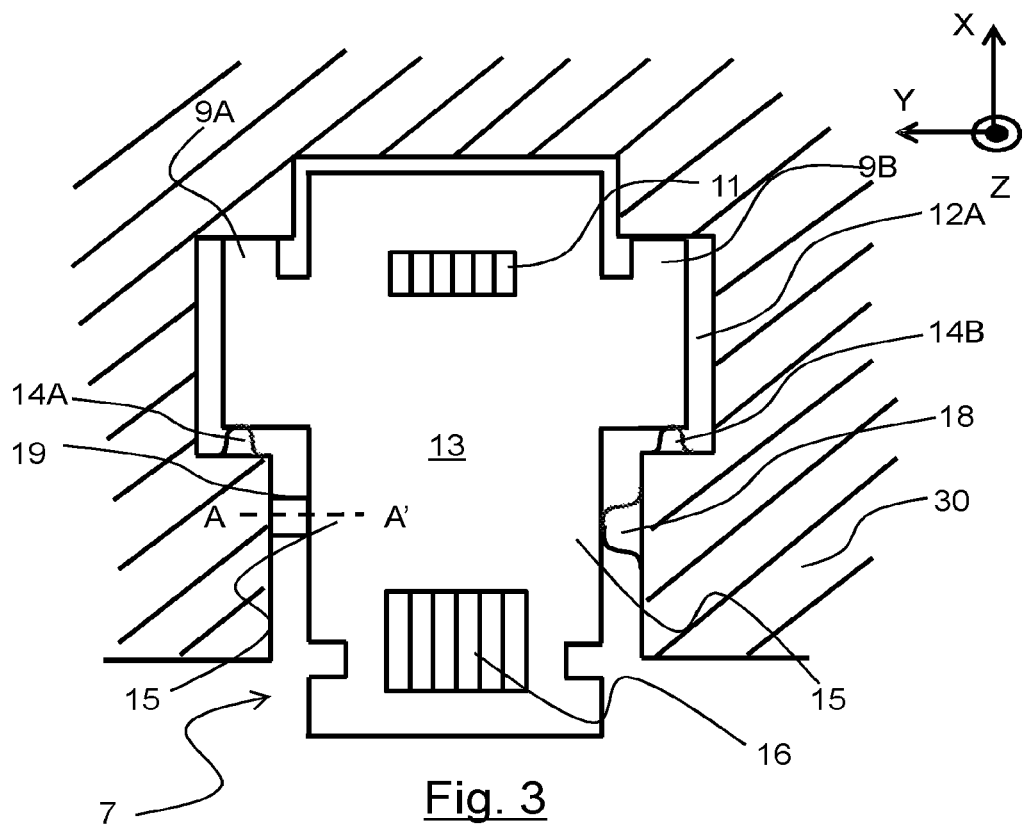
FIGS. 3 and 4 show a top view of the light source when it is held partially in a first housing of the optical means and partially in a second housing of the carrier of the optical means of the lighting module of FIG. 1, in a longitudinal direction X and in a transverse direction Y, according to a first nonlimiting embodiment.
Figure 4:
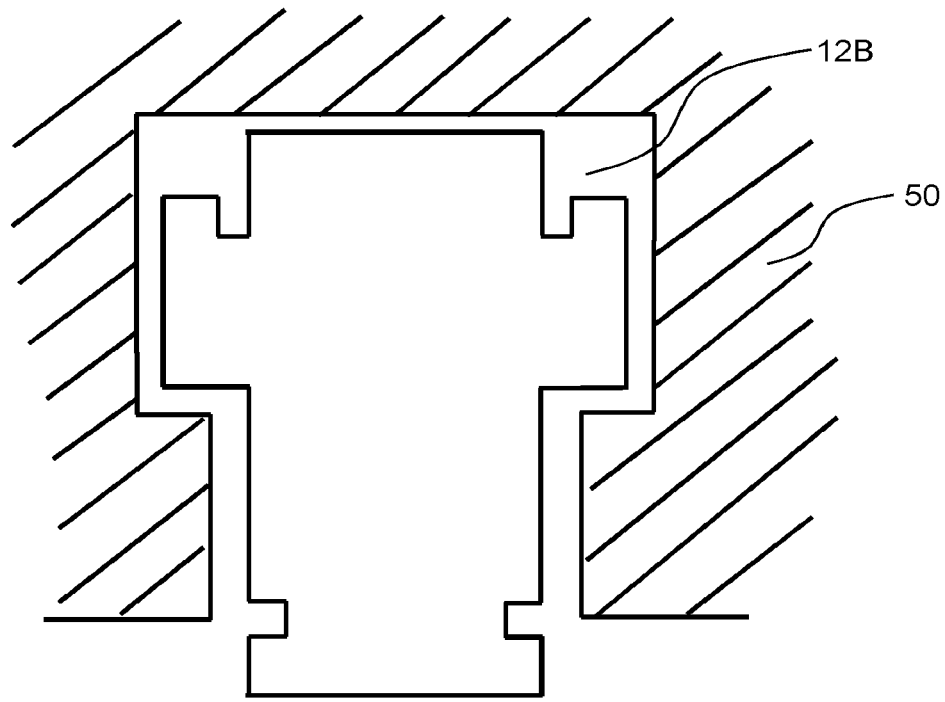

FIGS. 3 and 4 schematically show the base 30 of the optical means 3 and the base 50 of the carrier 5 of the optical means 3 of the lighting module 10, respectively, according to a first nonlimiting embodiment.

In one nonlimiting example, the optical means 3 is a reflector.

The optical means 3 includes a base 30 and a mirror 31. The mirror 31 performs the optical functions of the optical means 3. The base 30 carries the mirror 31 and comprises a contact area intended to make contact with the base 50 of the carrier 5 of the optical means 3. This base 30 defines the first housing 12A of the optical means 3 illustrated in FIG. 3.

The mechanical carrier 13 of the light source 7 includes two arms that are able to form two primary reference points 9A, 9B.

When the carrier 5 of the optical means 3 is in the open position, the light source 7 is positioned by the operator in the first housing 12A of the optical means 3, illustrated in FIG. 3.

The mechanical carrier 13 is blocked in the longitudinal direction X by two primary blocking means 14A, 14B. These two primary blocking means 14A, 14B act on the mechanical carrier 13 of the light-emitting means 11, so that the two primary reference points 9A, 9B abut against the internal wall of the housing 12A. The base 30 of the optical means 3 thus allows the isostatism in X of the light source 7 to be managed via the primary reference points 9A, 9B.

In one nonlimiting embodiment, the two primary blocking means 14A, 14B are two leaf springs. These two leaf springs allow the light source 7 to be easily maintained against the lighting module 10 in the longitudinal direction X.

The mechanical carrier 13 is blocked in the transverse direction Y by a first secondary blocking means 18. The first secondary blocking means 18 acts on the mechanical carrier 13, so that this mechanical carrier 13 abuts against a second secondary blocking means 19 placed facing the first secondary blocking means 18. The base 30 of the optical means 3 thus allows the isostatism in Y of the light source 7 to be managed via the first secondary blocking means 18 and the second secondary blocking means 19.

In one nonlimiting embodiment, the first secondary blocking means 18 is a leaf spring. This leaf spring allows the light source 7 to be easily maintained against the lighting module 10 in the transverse direction Y.

In one nonlimiting embodiment, the second secondary blocking means 19 is a chamfer. It is placed facing the leaf spring 18. The chamfer 19 and the leaf spring 18 are placed on either side of the light source 7. The chamfer 19 has an action complementary to the leaf spring 18. Specifically, it allows the light source 7 to be guided into and gradually blocked in the lighting module 10 in the transverse direction Y. FIG. 8 is a cross-sectional view along A-A' in FIG. 3 level with the chamfer 19. This chamfer comprises a beveled portion 19B and a straight portion 19A extending the beveled portion 19B. The beveled portion 19B is able to guide the light source 7 (which has been illustrated in dotted lines in an unblocked position) in the transverse direction Y and in the normal direction Z when the carrier 5 of the optical means 3 is moved toward the optical means 3. The straight portion 19A blocks the light source 7 (illustrated in solid lines) in the housing 12A of the base 30 once the carrier 5 of the optical means 3 is in the closed position.

When the carrier 5 of the optical means 3 is brought back against the optical means 3, the mechanical carrier 13 comes to be housed in the second housing 12B defined by the base 50 of the carrier 5 of the optical means 3, illustrated in FIG. 4. The carrier 5 of the optical means 3 is then in the closed position.

As was mentioned above, it is the rotation of the carrier 5 of the optical means 3 about the axis of rotation 6 that allows the first housing 12A and the second housing 12B to be placed directly opposite and the two bases 30 and 50 to be brought into contact.

As may be seen, in this first embodiment, the carrier 5 of the optical means 3 does not comprise primary or secondary blocking means.

In this first embodiment, to block the light source 7, this light source is first positioned in the first housing 12A of the optical means 3 and then in the second housing 12B of the carrier 5 of the optical means 3. By proceeding in this way, it is guaranteed that the light source 7 will be positioned with precision in the lighting module 10 and that it will remain stable in this position.

Second Embodiment

The lighting module 10 comprises the optical means 3, the carrier 5 of the optical means 3 and the light source 7 which were described above.

Figure 5:
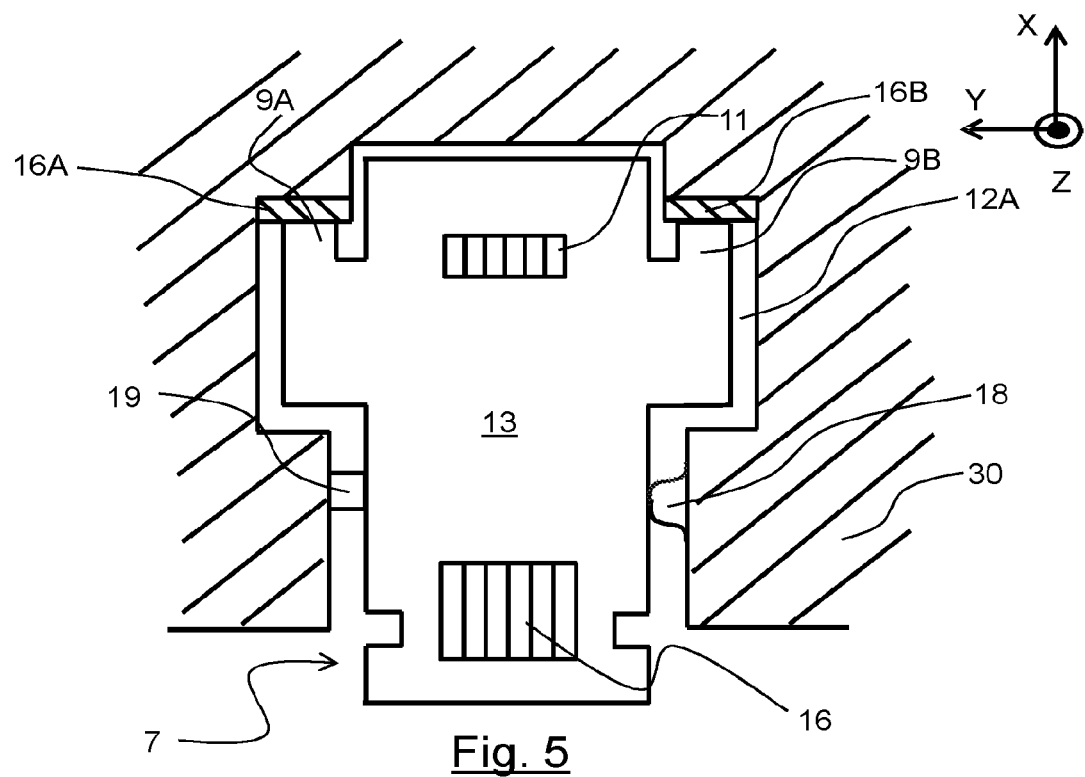
FIGS. 5 and 6 show a top view of the light source when it is held partially in a first housing of the optical means and partially in a second housing of the carrier of the optical means of the lighting module of FIG. 1, in the longitudinal direction X and in the transverse direction Y, according to a second nonlimiting embodiment.
Figure 6:
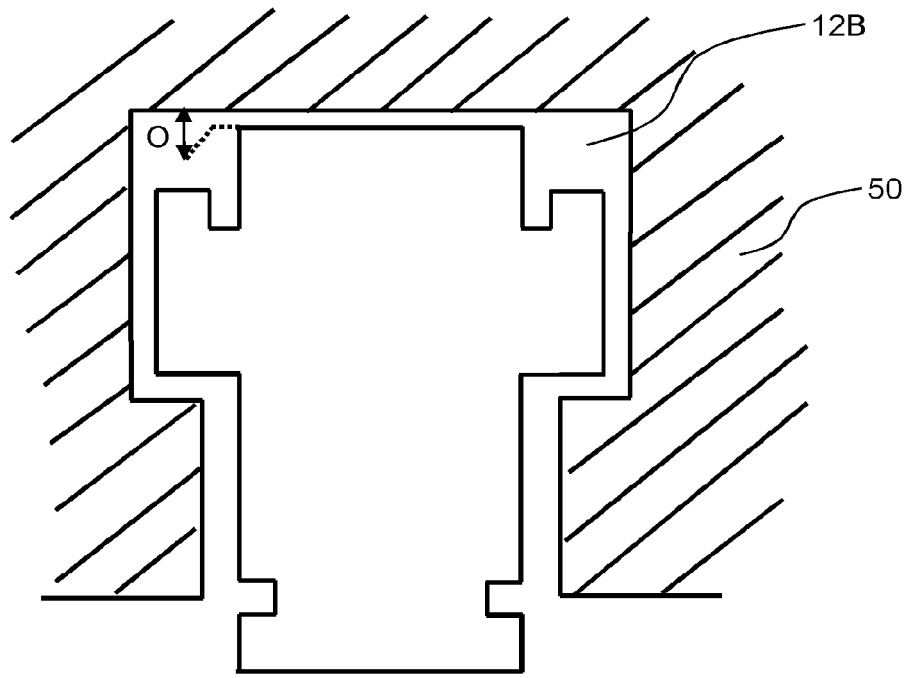

FIGS. 5 and 6 schematically show the base 30 of the optical means 3 and the base 50 of the carrier 5 of the optical means 3 of the lighting module 10, respectively, according to a second nonlimiting embodiment.

In one nonlimiting example, the optical means 3 is a reflector.

The optical means 3 includes a base 30 and a mirror 31. The mirror 31 performs the optical functions of the optical means 3. The base 30 carries the mirror 31 and comprises a contact area intended to make contact with the base 50 of the carrier 5 of the optical means 3. This base 30 defines the first housing 12A of the optical means 3 illustrated in FIG. 3.

The mechanical carrier 13 of the light source 7 includes two arms that are able to form two primary reference points 9A, 9B.

Thus, when the carrier 5 of the optical means 3 is in the open position, the light source 7 is positioned by the operator in the second housing 12B of the carrier 5 of the optical means 3, as illustrated in FIG. 6.

As may be seen in this first embodiment, the carrier 5 of the optical means 3 does not comprise primary or secondary blocking means of the light source 7. There is therefore play O between the mechanical carrier 13 of the light source 7 and the internal wall of the second housing 12B.

When the carrier 5 of the optical means 3 is brought back against the optical means 3, the mechanical carrier 13 comes to be housed in the first housing 12A defined by the base 30 of the optical means 3, illustrated in FIG. 5.

As was mentioned above, it is the rotation of the carrier 5 of the optical means 3 about the axis of rotation 6 that allows the first housing 12A and the second housing 12B to be placed directly opposite and the two bases 30 and 50 to be brought into contact.

The mechanical carrier 13 is blocked in the longitudinal direction X by two primary blocking means 16A, 16B. These two primary blocking means 16A, 16B are placed between the two primary reference points 9A, 9B and the internal wall of the housing 12A. The base 30 of the optical means 3 thus allows the isostatism in X of the light source 7 to be managed via the primary reference points 9A, 9B.

In one nonlimiting embodiment, the two primary blocking means 16A, 16B here are two chamfers. The chamfers allow the light source 7 to be guided into and gradually blocked in the lighting module 10, in the longitudinal direction X.

The mechanical carrier 13 is blocked in the transverse direction Y by a first secondary blocking means 18. The first secondary blocking means 18 acts on the mechanical carrier 13, so that this mechanical carrier 13 abuts against a second secondary blocking means 19 placed facing the first secondary blocking means 18.

In one nonlimiting embodiment, the first secondary blocking means 18 is a leaf spring. This leaf spring allows the light source 7 to be easily maintained against the lighting module 10 in the transverse direction Y. The base 30 of the optical means 3 thus allows the isostatism in Y of the light source 7 to be managed via the first secondary blocking means 18 and the second secondary blocking means 19.

In one nonlimiting embodiment, the second secondary blocking means 19 is a chamfer. It is placed facing the leaf spring 18. The chamfer 19 and the leaf spring 18 are placed on either side of the light source 7. The chamfer 19 has an action complementary to the leaf spring 18. Specifically, it allows the light source 7 to be guided into and gradually blocked in the lighting module 10, in the transverse direction Y.

It will be noted that for the chamfers 16A, 16B and 19 of FIG. 5, the same gradual blocking principle as that described for the chamfer 19 in FIG. 3, i.e. the chamfer used in the first nonlimiting embodiment, applies. Thus, FIG. 8 applies to the chamfers 16A, 16B and 19 of FIG. 5.

In this second embodiment, to block the light source 7, this light source 7 is therefore first positioned in the second housing 12B of the carrier 5 of the optical means 3 and then in the first housing 12A of the optical means 3. In the open position, it is thus easier for an operator to access the second housing 12B with a view to integrating the light source 7 into the lighting module 10.

Third Embodiment

The lighting module 10 comprises the optical means 3, the carrier 5 of the optical means 3 and the light source which were described above.

FIG. 5 schematically shows the base 30 of the optical means 3 of the lighting module 10 according to a third embodiment that is also nonlimiting.

Figure 7:
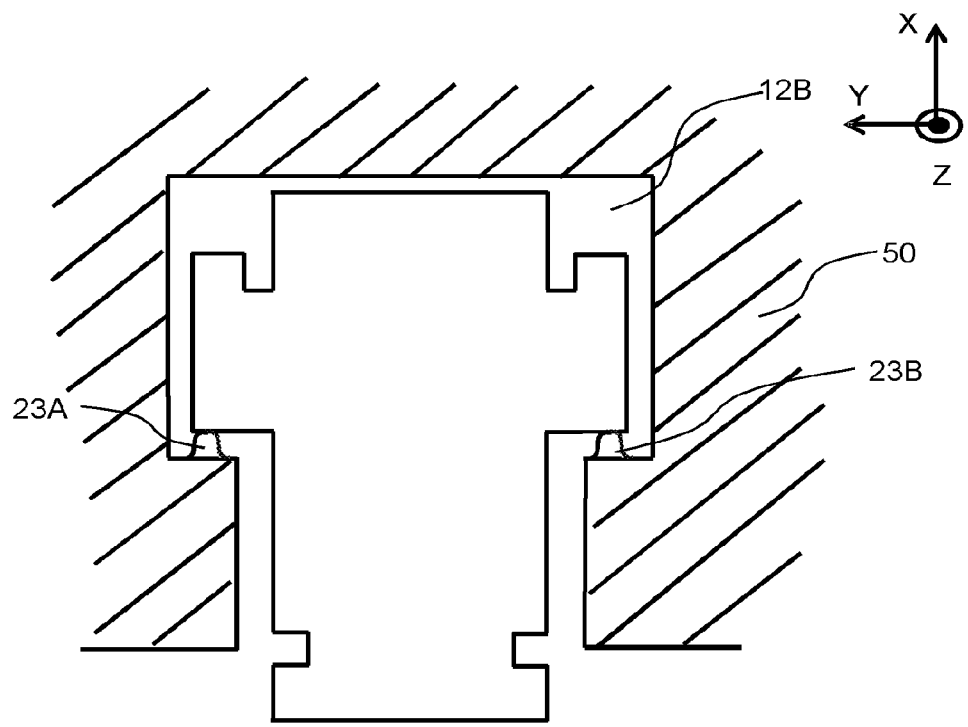
FIG. 7 shows a top view of the light source when it is held partially in a first housing of the optical means and partially in a second housing of the carrier of the optical means of the lighting module of FIG. 1, in the longitudinal direction X and in the transverse direction Y, according to a third nonlimiting embodiment.

FIG. 7 schematically shows the base 50 of the carrier 5 of the optical means 3 of the lighting module 10 according to a third nonlimiting embodiment.

In the same way as in the second embodiment, the light source 7 is first positioned in the second housing 12B of the carrier 5 of the optical means 3 then in the first housing 12A.

This third embodiment differs from the second embodiment in that the carrier 5 of the optical means 3 comprises two primary blocking means 23A, 23B for blocking the light source 7 in the longitudinal direction X.

In the closed position, i.e. when the base 30 of the optical means 3 and the base 50 of the carrier 5 of the optical means 3 make contact, the two primary blocking means 23A, 23B will act on the mechanical carrier 13 so that the two primary reference points 9A, 9B of this mechanical carrier 13 abut against the two primary blocking means 16A, 16B of FIG. 5. Thus, the blocking of the light source 7 in the longitudinal direction X, in the lighting module 10, is improved. The base 30 of the optical means 3 thus allows the isostatism in X of the light source 7 to be managed via the primary reference points 9A, 9B.

In one nonlimiting embodiment, the two primary blocking means 23A, 23B are leaf springs. These leaf springs allow the light source 7 to be easily maintained against the lighting module 10 in the longitudinal direction X.

Figure 11:
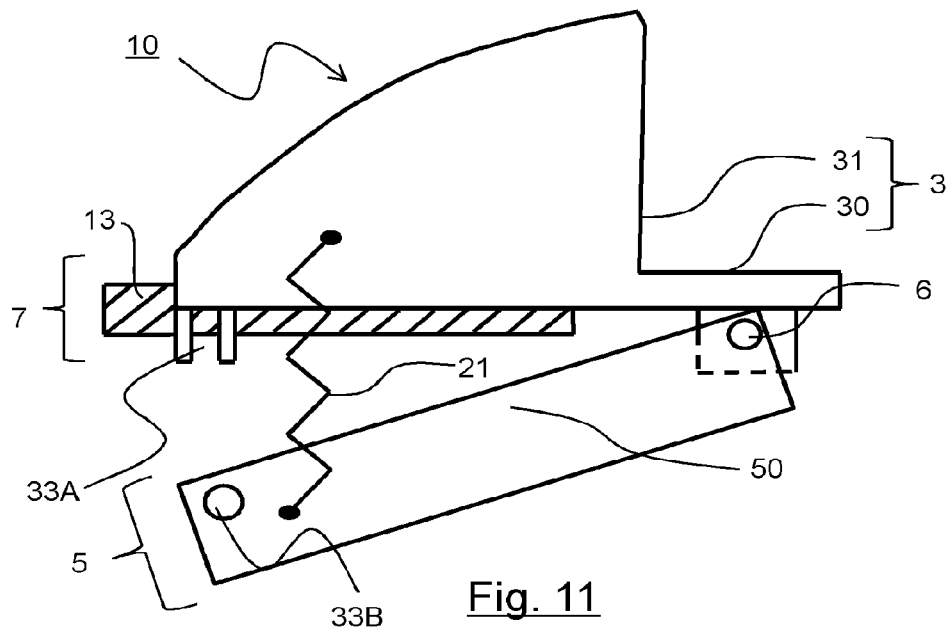
FIG. 11 shows, according to one nonlimiting embodiment, a cross-sectional view of the lighting module of FIG. 1, said lighting module comprising locking means.

Apart from the optical module 3, the carrier 5 of the optical module 3, the light source 7 and the moving means 21 described in the above three embodiments, in a nonlimiting embodiment illustrated in FIG. 11, the lighting module 10 comprises locking means 33A, 33B for locking the optical means 3 with the carrier 5 of the optical means 3. These locking means comprise:

a receiving zone 33A belonging to the base 30 of the optical means 3 and;

a pin 33B belonging to the base 50 of the carrier 5 of the optical means 3. The pin 33B is able to jam into the receiving zone 33A when the carrier 5 of the optical means 3 is in the closed position.

In nonlimiting variants, the locking means comprise:

a hook or;

a screw-based system;

a bolt or;

clip-fastening means or;

a magnet.

Figure 12:
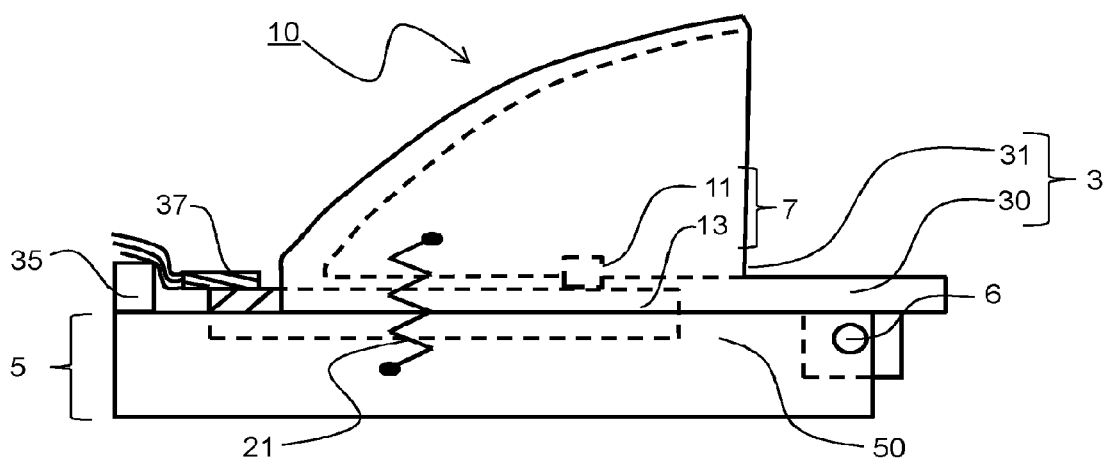
FIG. 12 shows, according to one nonlimiting embodiment, a cross-sectional view of the lighting module of FIG. 1, said lighting module comprising wedging means for holding a power-supply connector of the light source in said lighting module.

As described above, the electrical-connection interface 16 of the light source 7 is able to interact with an external electrical connector 37 (illustrated in FIG. 10) of the light source 7. In order to prevent disconnection of this external electrical connector during use of the motor vehicle, in one nonlimiting embodiment illustrated in FIG. 12, the lighting module 10 furthermore comprises wedging means 35 for holding the external electrical connector 37 in the lighting module 10. The wedging means 35 belong to the base 50 of the carrier 5 of the optical means 3.

Of course, the description of the invention is not restricted to the embodiments described above.

Thus, in one nonlimiting embodiment, the moving means 21 comprise a cam-based system (not shown in the figures). This cam-based system comprises a cam and a pivot that is securely fastened to the carrier of the optical means. The cam-based system allows a rotational movement of the cam about the pivot to be converted, simply and practically, into a translational and/or rotational movement of the optical means. The cam-based system holds the carrier of the optical means in its open position throughout the operation of changing the light source.

Thus, in one nonlimiting embodiment, the light source 7 furthermore comprises means for gripping said mechanical carrier 13. These gripping means are placed on said mechanical carrier 13 in proximity to the electrical-connection interface 16. It will be noted that these gripping means are arranged on said mechanical carrier 13 so as not to impede connection between an external electrical connector and the electrical-connection interface 16.

Thus, in one nonlimiting embodiment, the light source 7 does not have a protective cover 27. In this case, there are two tertiary reference points and the edges of the optical means 3 will bear against these reference points in the closed position.

Thus, in one nonlimiting embodiment, the lighting module 10 comprises two return springs 21 that are placed directly opposite, on either side of the light source 7, in order to promote the return of the carrier 5 of the optical means 3 toward the optical means 3.

Thus, in one nonlimiting embodiment, provision is made to deposit, on the internal walls of the second housing 12B, a conductive thermal foam or paste in order to promote the removal of the heat given off by the light-emitting means 11 to the carrier 5 of the optical means 3.

Thus, the described invention in particular has the following advantages:
- replacement of a defective light source is easier;
- there is no need to remove the optical means 3 in order to perform the replacement operation;
- there is no need to scrap the entire optical means 3 just to replace one light source, thereby substantially decreasing the cost of replacing said light source;
- once the light source has been removed, it is possible to identify and change only the defective element of this light source 7;
- a system that is simple to manipulate is used to release the light source. It is enough for the operator to pivot the carrier 5 of the optical means 3 about the axis of rotation 6.

The invention claimed is:

1. A lighting module for a motor vehicle, said lighting module comprising:
   an optical device configured to interact with light to form light rays, the optical device being fixedly mounted in the lighting module, said optical device comprising a base with a first housing;
   an optical device carrier configured to carry the optical device, which is movable with respect to the optical device about a single axis of rotation, said optical device carrier comprising a base with a second housing, said optical device carrier being configured to move between a closed position and an open position, wherein
      in the closed position at least one light source is held partially in said first housing and partially in said second housing, and
      in the open position said at least one light source may be removed from the lighting module; and
   said at least one light source being removable and comprising:
      a semiconductor light-emitting chip configured to emit light;
      a mechanical carrier configured to carry the semiconductor light-emitting chip.

2. The lighting module according to claim 1, wherein the light source is blocked in the first housing or in the second housing:
   in a longitudinal direction (X) at two primary reference points via two primary blockers of the base of the optical device or the base of the optical device carrier; and
   in a transverse direction (Y), perpendicular to the longitudinal direction (X), at at least one secondary reference point via a secondary blocker.

3. The lighting module according to claim 2, wherein a primary blocker is a leaf spring.

4. The lighting module according to claim 2, wherein a primary blocker is a chamfer.

5. The lighting module according to claim 2, wherein a secondary blocker is a leaf spring of the base of the optical device.

6. The lighting module according to claim 5, wherein a second secondary blocker is used to block the light source in the transverse direction (Y), said second secondary blocker being a chamfer of the base of the optical device facing said leaf spring, the chamfer and the leaf spring being placed on either side of the light source.

7. The lighting module according to claim 1, wherein the optical device and the optical device carrier are mechanically connected to each other in order to ensure rotational guidance of the optical device carrier with respect to said optical device.

8. The lighting module according to claim 1, wherein the lighting module furthermore includes a mechanical member configured to move the optical device carrier with respect to the optical device, the mechanical member allowing the optical device carrier to move rotatably between said closed position and said open position.

9. The lighting module according to claim 8, wherein the mechanical member is a return spring.

10. The lighting module according to claim 1, wherein the light source is configured to be positioned in said first housing of the optical device when the optical device carrier is in the open position.

11. The lighting module according to claim 10, wherein the optical device comprises:
   at least two primary blockers configured to block the light source in the first housing in the longitudinal direction (X); and
   at least one secondary blocker configured to block the light source in the first housing in the transverse direction (Y).

12. The lighting module according to claim 1, wherein the light source is configured to be positioned in said second housing of the optical device carrier when said carrier is in the open position.

13. The lighting module according to claim 12, wherein the optical device comprises:
   at least two primary blockers configured to block the light source in the first housing in the longitudinal direction (X); and
   at least one secondary blocker configured to block the light source in the first housing in the transverse direction (Y).

14. The lighting module according to claim 13, wherein the optical device carrier comprises two primary blockers configured to block the light source in the second housing in the longitudinal direction (X).

15. The lighting module according to claim 1, wherein the light source is blocked in the first housing in a normal direction (Z) at at least three tertiary reference points.

16. The lighting module according to claim 15, wherein the three tertiary reference points are three lugs belonging to a protective cover of the light source, said lugs being configured to interact with a countersink belonging to the base of the optical device.

17. The lighting module according to claim 1, wherein said lighting module furthermore comprises a lock configured to lock the optical device with the optical device carrier.

18. The lighting module according to claim 1, said lighting module furthermore comprising a wedge configured to hold an external electrical connector of the light source in said lighting module.

19. The lighting module according to claim 1, wherein the optical device carrier is a radiator.

20. The lighting module according to claim 1, wherein the semiconductor emitting chip includes a light-emitting diode (LED), an organic LED (OLED), an active-matrix organic LED (AMOLED), or a flexible OLED (FOLED).

* * * * *